US012107201B2

(12) United States Patent
Jeon et al.

(10) Patent No.: US 12,107,201 B2
(45) Date of Patent: Oct. 1, 2024

(54) SEMICONDUCTOR LIGHT EMITTING DEVICE AND METHOD OF MANUFACTURING THE SAME

(71) Applicant: Lumens Co., Ltd., Yongin-si (KR)

(72) Inventors: Soo Kun Jeon, Gyeonggi-do (KR); Seung Ho Baek, Gyeonggi-do (KR); Won Jae Choi, Gyeonggi-do (KR); Geun Mo Jin, Gyeonggi-do (KR); Yeon Ho Jeong, Gyeonggi-do (KR); Geon Il Hong, Gyeonggi-do (KR)

(73) Assignee: Lumens Co., Ltd., Yongin-si (KR)

( * ) Notice: Subject to any disclaimer, the term of this patent is extended or adjusted under 35 U.S.C. 154(b) by 549 days.

(21) Appl. No.: 17/330,505

(22) Filed: May 26, 2021

(65) Prior Publication Data
US 2021/0376212 A1    Dec. 2, 2021

(30) Foreign Application Priority Data

May 26, 2020    (KR) .................. 10-2020-0063110

(51) Int. Cl.
| | | |
|---|---|---|
| *H01L 33/62* | (2010.01) | |
| *H01L 33/00* | (2010.01) | |
| *H01L 33/36* | (2010.01) | |
| *H01L 33/38* | (2010.01) | |
| *H01L 33/40* | (2010.01) | |
| *H01L 33/48* | (2010.01) | |

(Continued)

(52) U.S. Cl.
CPC .............. *H01L 33/62* (2013.01); *H01L 33/54* (2013.01); *H01L 33/60* (2013.01); *H01L 2933/005* (2013.01); *H01L 2933/0066* (2013.01)

(58) Field of Classification Search
CPC ....... H01L 33/62; H01L 33/486; H01L 33/52; H01L 33/38; H01L 2933/0066; H01L 24/96
See application file for complete search history.

(56) References Cited

U.S. PATENT DOCUMENTS

| | | |
|---|---|---|
| 7,262,436 B2 | 8/2007 | Kondoh et al. |
| 8,008,683 B2 | 8/2011 | Choi et al. |
| 2011/0024786 A1 | 2/2011 | Sugiyama |

(Continued)

FOREIGN PATENT DOCUMENTS

| | | |
|---|---|---|
| CN | 102881779 | 1/2013 |
| CN | 110707203 | 1/2020 |

(Continued)

OTHER PUBLICATIONS

Office Action dated Jun. 1, 2024 issued in Chinese Patent Application No. 202110570000.5.

*Primary Examiner* — Antonio B Crite
(74) *Attorney, Agent, or Firm* — PnK IP LLC

(57) ABSTRACT

The present disclosure relate to a semiconductor light emitting device and a method for manufacturing the same. The semiconductor light emitting device comprises a semiconductor light emitting chip, and first electrodes electrically connected to the semiconductor light emitting chip, with the first electrodes each having a planar area larger than that of the semiconductor light emitting chip, wherein lower surfaces of the first electrodes are exposed externally, and an insulating material is filled in-between inner lateral surfaces of the first electrodes.

12 Claims, 10 Drawing Sheets

(51) Int. Cl.
*H01L 33/54* (2010.01)
*H01L 33/60* (2010.01)

(56) References Cited

U.S. PATENT DOCUMENTS

2011/0278717 A1\* 11/2011 Pagaila ............... H01L 23/3677
257/E23.101
2015/0091035 A1\* 4/2015 Kim ........................ H01L 33/54
257/98

FOREIGN PATENT DOCUMENTS

| KR | 10-1277254 | 6/2013 |
| KR | 10-2013-0114011 A | 10/2013 |
| KR | 10-2014-0127457 A | 11/2014 |

\* cited by examiner

SEMICONDUCTOR LIGHT EMITTING DEVICE AND METHOD OF MANUFACTURING THE SAME

CROSS-REFERENCE TO RELATED APPLICATION

This application claims the benefit of and priority to Korean Application No. 10-2020-0063110 filed on 26 May 2020. The entire disclosure of the above application is incorporated herein by reference.

FIELD

The present disclosure relates generally to a semiconductor light emitting device, and more particularly, to a semiconductor light emitting device that emits ultraviolet light, features higher efficiency of light emission, and has an increased luminous efficiency with a lowered operating voltage. In addition, it relates to a method for manufacturing such semiconductor light emitting devices.

In the context herein, the term "semiconductor light emitting device" refers to a semiconductor optoelectronic device which generates light by electron-hole recombination. One example thereof is Group III-nitride semiconductor light emitting devices, in which the Group III-nitride semiconductor is composed of a compound containing Al(x)Ga(y)In(1-x-y)N (0≤x≤1, 0≤y≤1, 0≤x+y≤1). Another example thereof is GaAs-based semiconductor light emitting devices used for emitting red light.

BACKGROUND

This section provides background information related to the present disclosure which is not necessarily prior art. Directional terms, such as "upper", "lower", "above", "below" or others used herein are defined with respect to the directions in the drawings.

FIG. 1 shows an example of a semiconductor light emitting chip in the prior art.

The semiconductor light emitting device includes a growth substrate 10 (e.g., a sapphire substrate), and a stack of semiconductor layers sequentially deposited on the growth substrate 10, including a buffer layer 20, a first semiconductor layer 30 having a first conductivity (e.g., an n-type GaN layer), an active layer 40 for generating light by electron-hole recombination (e.g., an InGaN/(In)/GaN multiple quantum well (MQW) structure), and a second semiconductor layer 50 having a second conductivity different from the first conductivity (e.g., a p-type GaN layer). The semiconductor light emitting device further includes a light transmitting conductive film 60 for current spreading formed on the second semiconductor layer 50, a pad electrode 70 serving as a bonding pad formed on the light transmitting conductive film 60, and a pad electrode 80 serving as a bonding pad (e.g., a stack of Cr/Ni/Au metallic pads) formed on an etched exposed portion of the first semiconductor layer 30. This particular type of the semiconductor light emitting device as shown in FIG. 1 is called a lateral chip. Here, one side of the growth substrate 10 serves as a mounting face during electrical connections to an external substrate. In the context herein, the term "external substrate" to which a semiconductor light emitting chip or a semiconductor light emitting device is electrically connected refers to a PCB (Printed Circuit Board), a submount, a TFT (Thin Film Transistor) or the like.

FIG. 2 shows another example of a semiconductor light emitting chip disclosed in U.S. Pat. No. 7,262,436. For convenience of description, similar components may have the same or different reference numerals and technical terms as appropriate.

In this semiconductor light emitting chip, there is provided a growth substrate 10, and a stack of layers sequentially deposited on the growth substrate 10, including a first semiconductor layer 30 having a first conductivity, an active layer 40 adapted to generate light by electron-hole recombination and a second semiconductor layer 50 having a second conductivity different from the first conductivity. Three-layered electrode films 90, 91 and 92 adapted to reflect light towards the growth substrate 10 are then formed on the second semiconductor layer 50. These electrode films 90, 91 and 92 are pad electrodes serving as bonding pads. In particular, a first electrode film 90 can be a reflecting Ag film, a second electrode film 91 can be a Ni diffusion barrier, and a third electrode film 92 can be an Au bonding film. Further, a pad electrode 80 serving as a bonding pad is formed on an etched exposed portion of the first semiconductor layer 30. Here, one side of the electrode film 92 serves as a mounting face during electrical connections to an external substrate. This particular type of the semiconductor light emitting chip as shown in FIG. 2 is called a flip chip. In this flip chip of FIG. 2, the electrode 80 formed on the first semiconductor layer 30 is placed at a lower height level than the electrode films 90, 91 and 92 formed on the second semiconductor layer 50, but alternatively, it may be formed at the same height level as the electrode films. Here, height levels are given with respect to the growth substrate 10.

FIG. 3 shows another example of a semiconductor light emitting chip disclosed in U.S. Pat. No. 8,008,683. For convenience of description, similar components may have the same or different reference numerals and technical terms as appropriate.

The semiconductor light emitting chip includes a stack of semiconductor layers sequentially deposited on a growth substrate, including a first semiconductor layer 30 having a first conductivity, an active layer 40 for generating light by electron-hole recombination, and a second semiconductor layer 50 having a second conductivity different from the first conductivity; an upper electrode 31 formed on a side free of the growth substrate; a supporting substrate 51 for supporting the semiconductor layers 30, 40 and 50 while supplying current to the second semiconductor layer 50; and a lower electrode 52 formed on the supporting substrate 51. The upper electrode 31 is electrically connected to an external substrate by wire bonding. One side of the lower electrode 52 serves as a mounting face during electrical connections to the external substrate. The semiconductor light emitting device as shown in FIG. 3 is called a vertical chip where the electrodes 31 and 51 are disposed above and below the active layer 40, respectively.

FIG. 4 shows another example of a semiconductor light emitting device in the prior art.

The semiconductor light emitting device 100 has lead frames 110 and 120, a mold 130, and a vertical-type light emitting chip 150 in a cavity 740 which is filled with an encapsulation member 170 containing a wavelength converting material 160. The lower surface of the vertical-type light emitting chip 150 is directly electrically connected to the lead frame 110, and the upper surface thereof is electrically connected to the lead frame 120 by a wire 180. A portion of the light coming out of the vertical-type light emitting chip 150 excites the wavelength converting material 160 such that lights of different colors are generated, and white light is produced by mixing two different lights. For instance, the semiconductor light emitting chip 150 generates blue light, and the wavelength converting material 160 is excited to generate yellow light. Then these blue and yellow lights can be mixed to produce white light. Alternatively, while the semiconductor light emitting device shown in FIG. 4 includes the vertical-type light emitting chip 150 as shown in FIG. 3, it may also be obtained utilizing the semiconductor light emitting chips as illustrated in FIG. 1 and FIG. 2.

Such a semiconductor light emitting devices shown in FIG. 4 is generally referred to as a package-type semiconductor light emitting device, and a semiconductor light emitting device with the size of a chip is referred to as a CSP (Chip Scale Package)-type semiconductor light emitting device. Description relevant to CSP type semiconductor light emitting devices can be found in Korean Patent Laid-Open Publication No. 10-2014-0127457. To keep abreast with high demands for a smaller size semiconductor light emitting device, more studies on CSP type semiconductor light emitting devices are currently underway. However, as the CSP type semiconductor light emitting device uses a micro semiconductor light emitting device chip with a maximum width of 150 μm or less and preferably 100 μm or less on a plane, the size of the pad electrode should also be reduced, resulting in increased thermal resistance and greater limitation in assembly tolerance.

FIG. 5 shows an example of a CSP type semiconductor light emitting device disclosed in Korean Patent Laid-Open Publication No. 2013-0114011. For convenience of description, similar components may have the same or different reference numerals and technical terms as appropriate.

The semiconductor light emitting device 100 includes a semiconductor light emitting chip 150 with pad electrodes 151 and 152, first electrodes 191 and 192 electrically connected to an external substrate, an insulation layer 190, and an encapsulation member 170.

With the pad electrodes 151 and 152 in this CSP type semiconductor light emitting device 100 of FIG. 5 being electrically connected to an external substrate, the above problems associated with smaller pad electrodes 151 and 152 of the semiconductor light emitting chip 150 may be resolved. However, during the manufacture of the semiconductor light emitting device 100, the first electrodes 190 and 191 or the insulation layer 190 may undergo a high-temperature process, e.g., deposition, after the resin-based encapsulation layer 170 is formed, meaning that the encapsulation layer 170 may possibly expand or contract due to the change in temperature. Consequently, this reduces the adhesion between the first electrodes 191 and 192 or the insulation layer 190 and the encapsulation layer 170, such that the first electrodes 191 and 192 or the insulation layer 190 may be easily peeled off. In addition, the resin-based encapsulation layer which has already been cured is again subjected to heat during the deposition process and may suffer change or deterioration in its properties such as adhesion strength, light transmittance, and so on. Moreover, since no insulating material is provided between the first electrodes 191 and 192, a short-circuit problem may occur during the electrical connection between the first electrodes 191 and 192 and the external substrate.

Accordingly, there is a need to achieve a semiconductor light emitting device and a method for manufacturing the same, which would alleviate the problems in relation to smaller pad electrodes of a semiconductor light emitting chip for use in a CSP type semiconductor light emitting device as well as improve the adhesion between the encapsulation layer and the electrodes (e.g., the first electrodes in FIG. 5) being electrically connected to an external substrate.

SUMMARY

This section provides a general summary of the disclosure and is not a comprehensive disclosure of its full scope or all of its features.

According to one aspect of the present disclosure, there is provided a semiconductor light emitting device comprising: a semiconductor light emitting chip; and first electrodes electrically connected to the semiconductor light emitting chip, with the first electrodes each having a planar area larger than that of the semiconductor light emitting chip, wherein lower surfaces of the first electrodes are exposed externally, and an insulating material is filled in-between the inner lateral surfaces of the first electrodes.

According to another aspect of the present disclosure, there is provided a method for manufacturing a semiconductor light emitting device, comprising: preparing a sacrificial substrate including a light-transmitting support plate and a sacrificial layer formed on the light-transmitting support plate; forming first electrodes on the sacrificial substrate; electrically connecting at least one semiconductor light emitting chip to the first electrodes; and removing the sacrificial substrate to expose the first electrodes externally.

DETAILED DESCRIPTION

The present disclosure will now be described in detail with reference to the accompanying drawings. Again, directional terms, such as "upper", "lower", "above", "below" or others used herein are defined with respect to the directions in drawings.

FIG. 6 shows an exemplary embodiment of a semiconductor light emitting device according to the present disclosure.

Figure 6A:
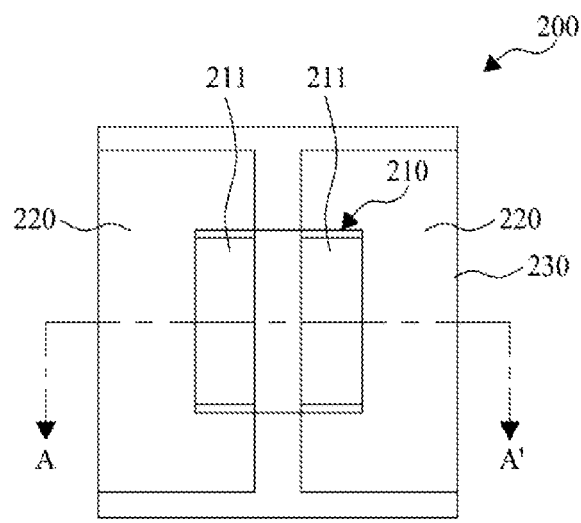
FIGS. 6A and 6B shows an exemplary embodiment of a semiconductor light emitting device according to the present disclosure.
Figure 6B:
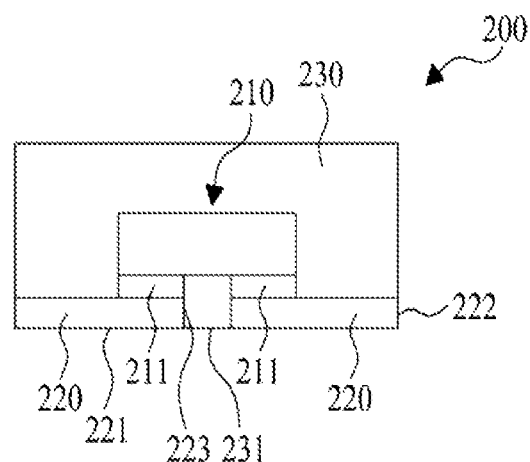

FIG. 6(a) is a bottom view and FIG. 6(b) is a cross-sectional view taken along AA'.

The semiconductor light emitting device 200 includes a semiconductor light emitting chip 210, first electrodes 220, and an encapsulation member 230 covering the semiconductor light emitting chip 210 and the first electrodes 220.

The semiconductor light emitting chip 210 shown in FIG. 6 is a flip chip with pad electrodes 211 but is not limited thereto. For example, it may be a lateral chip or a vertical chip. The pad electrodes 211 may be made of the same material as the first electrodes 220.

The first electrodes 220 may be made of Au (gold) or may be formed by staking one or more metals (e.g., Cr/Ni/Au). Lower surfaces 221 and outer surfaces 222 of the first electrodes 220 are exposed from the encapsulation member 230. Referring to FIG. 6(a), the size of a planar area of each of the first electrodes 220 is larger than that of the semiconductor light emitting chip 210 as well as of the pad electrodes 211. Thus, the semiconductor light emitting device 200 according to the present disclosure is electrically connected to an external substrate, e.g., a PCB, through the first electrodes 220, which in turn resolves a thermal resistance and assembly tolerance caused by smaller semiconductor light emitting chips 210.

The encapsulation member 230 may be made of a light-transmitting material (e.g., polyimide, epoxy resin, etc.). Also, the encapsulation member 230 itself is an insulating material such that the insulation effects would be improved as the encapsulation member 230 is arranged between the first electrode 220 and an inner lateral surface 223. The lower surface 231 of the encapsulation member 230 and the lower surfaces 221 of the first electrodes 220 are joined or leveled evenly without a step. Unless a step is intentionally created, the definition of "without a step" herein is intended to embrace a step within a several μm range if produced by the manufacturing tolerance.

FIG. 7 shows another exemplary embodiment of a semiconductor light emitting device according to the present disclosure.

Figure 7A:
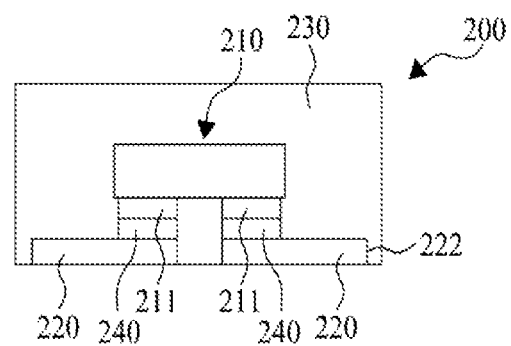
FIGS. 7A and 7B shows another exemplary embodiment of a semiconductor light emitting device according to the present disclosure.
Figure 7B:
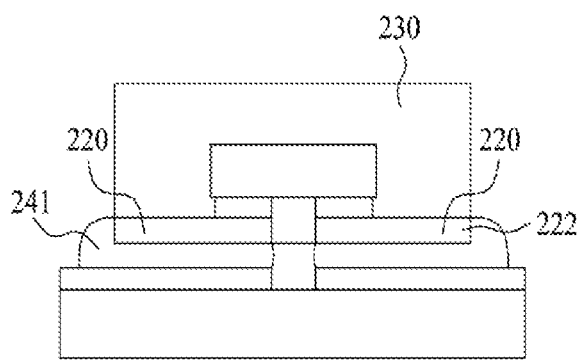

In this type of the semiconductor light emitting device 200, the pad electrodes 211 of the semiconductor light emitting chip 210 and the first electrodes 220 may be electrically connected through a conductive adhesive material 240. As will be further described below with reference to FIG. 9, the semiconductor light emitting device 200 of the present disclosure may require electrical connection through the conductive adhesive material 240 as the first electrodes 220 are formed first and are then electrically connected with the semiconductor light emitting chip 210. For example, the conductive adhesive material 240 may be one of solder balls (e.g., AuSn, SAC, SnAg) or Ag (silver) pastes. The encapsulation member 230 may cover outer surfaces 222 of the first electrodes 220. This ensures that the outer surfaces 222 of the first electrodes 220 are not only protected from metal burrs on the first electrodes 220 during cutting (see FIG. 9) especially when the outer surfaces 222 of the first electrodes 220 are exposed from the encapsulation member 230 as shown in FIG. 6, but they are also protected from a solder 241, as illustrated in FIG. 7(b), which may get on over the outer surfaces 222 of the first electrodes 220 during the SMT process for attaching the semiconductor light emitting device 200 to an external substrate (e.g., a PCB). Except for the features described above with reference to FIG. 7, the semiconductor light emitting device 200 illustrated in FIG. 7 is substantially the same as the semiconductor light emitting device 200 illustrated in FIG. 6.

Figure 8:
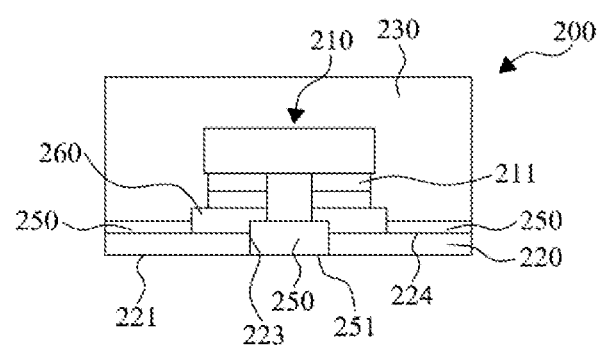
FIG. 8 shows another exemplary embodiment of a semiconductor light emitting device according to the present disclosure.

FIG. 8 shows another exemplary embodiment of a semiconductor light emitting device according to the present disclosure.

The semiconductor light emitting device 200 may include an insulation layer 250 with a thru hole, between the encapsulation member 230 and the first electrodes 220. The structure of the insulation layer 250 with a thru hole will be described in more details in FIG. 12 below. The insulation layer 250 may be made of an insulating material including at least one selected from the group consisting of silicon dioxide ($SiO_2$), aluminum oxide ($Al_2O_3$), silicon nitride, epoxy resin, and polyimide, for example. With the insulation layer 250 covering upper surfaces 224 of the first electrodes 220 and filling between the inner lateral surfaces 223 of the first electrodes 220, the risk of a short circuit can be greatly reduced. The pad electrodes 211 of the semiconductor light emitting chip 210 can be electrically connected to the first electrodes 220 through the thru hole. In addition, the distance between the inner lateral surfaces 223 of the first electrodes 220 may need to be larger than the distance between the pad electrodes 211 of the semiconductor light emitting chip 210 in order to ensure the stability of assembly processes. This can be achieved by forming second electrodes 260 in the thru hole to facilitate the electrical connection between the first electrodes 220 and the pad electrodes 211 of the semiconductor light emitting chip 210. The second electrodes 260 may be made of the same material as the first electrodes 220. In order to increase the luminous efficiency of the semiconductor light emitting device 200, the insulation layer 250 is preferably capable of reflecting light emitted from the semiconductor light emitting chip 210. For instance, the insulation layer 250 may be a DBR (Distributed Bragg Reflector). The lower surfaces 211 of the first electrodes 220 and the lower surface 251 of the insulation layer 250 disposed between the inner lateral surfaces 223 of the first electrodes 220 are joined or leveled evenly without a step. As mentioned earlier, unless a step is intentionally created, the definition of "without a step" herein is intended to embrace a step within a several μm range if produced by the manufacturing tolerance. Except for the features described above with reference to FIG. 8, the semiconductor light emitting device 200 illustrated in FIG. 8 is substantially the same as the semiconductor light emitting device 200 illustrated in FIG. 6.

Figure 9:
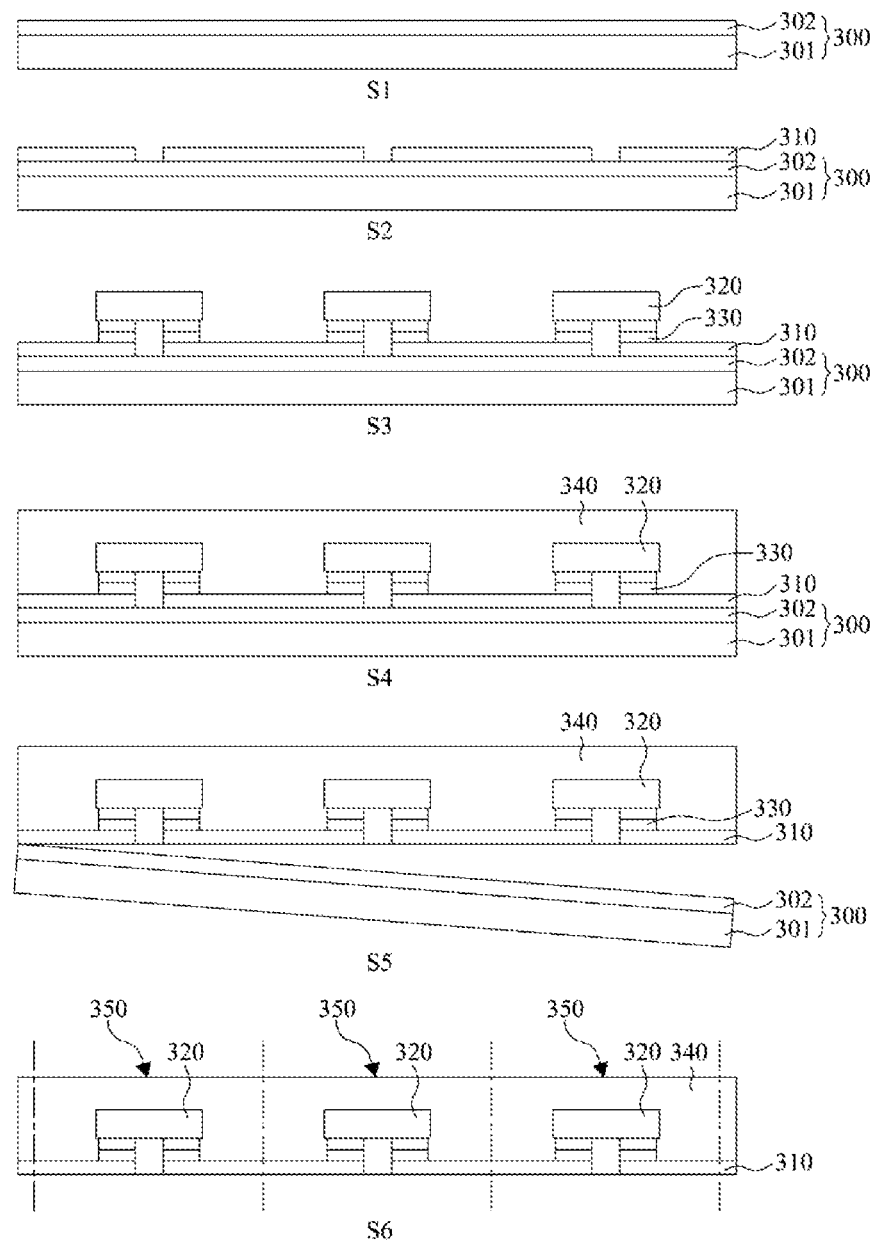
FIGS. 9 and 10 show an exemplary embodiment of a method for manufacturing a semiconductor light emitting device according to the present disclosure.
Figure 10:
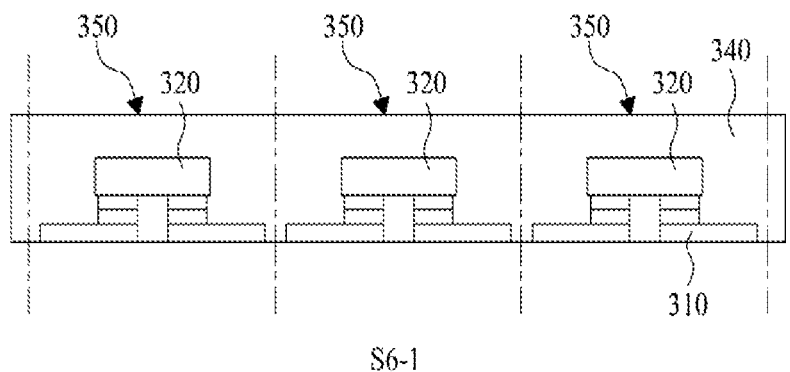

FIGS. 9-10 show an exemplary embodiment of a method for manufacturing a semiconductor light emitting device according to the present disclosure.

Figure 1:
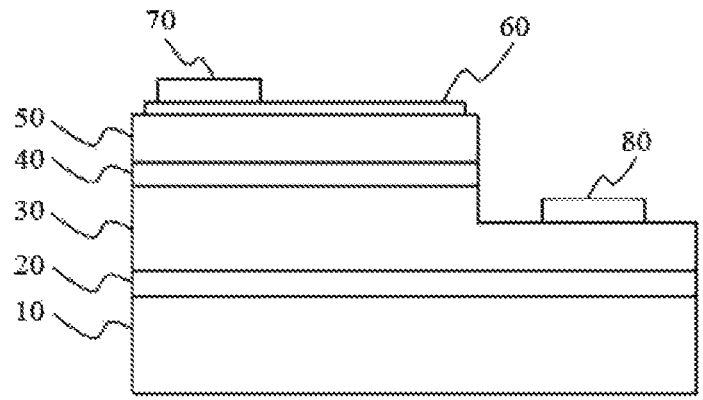
FIG. 1 shows an example of a semiconductor light emitting device in the prior art.
Figure 2:
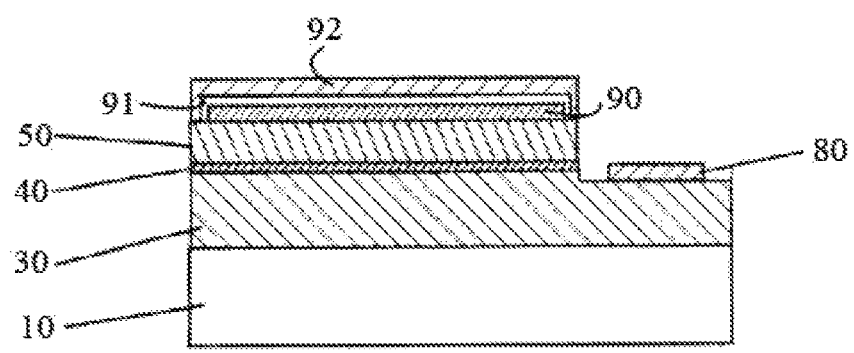
FIG. 2 shows another example of a semiconductor light emitting device disclosed in U.S. Pat. No. 7,262,436.
Figure 3:
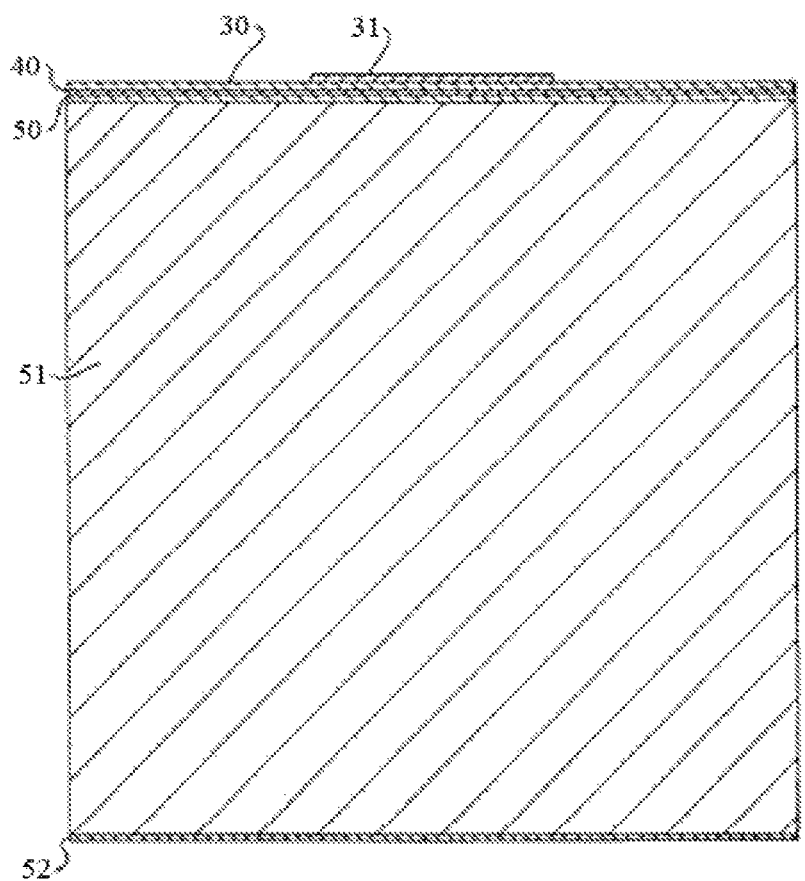
FIG. 3 shows another example of a semiconductor light emitting chip disclosed in U.S. Pat. No. 8,008,683.
Figure 4:
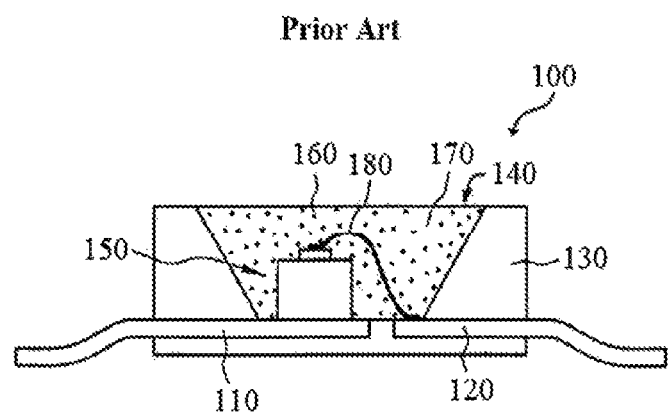
FIG. 4 shows another example of a semiconductor light emitting device in the prior art.
Figure 5:
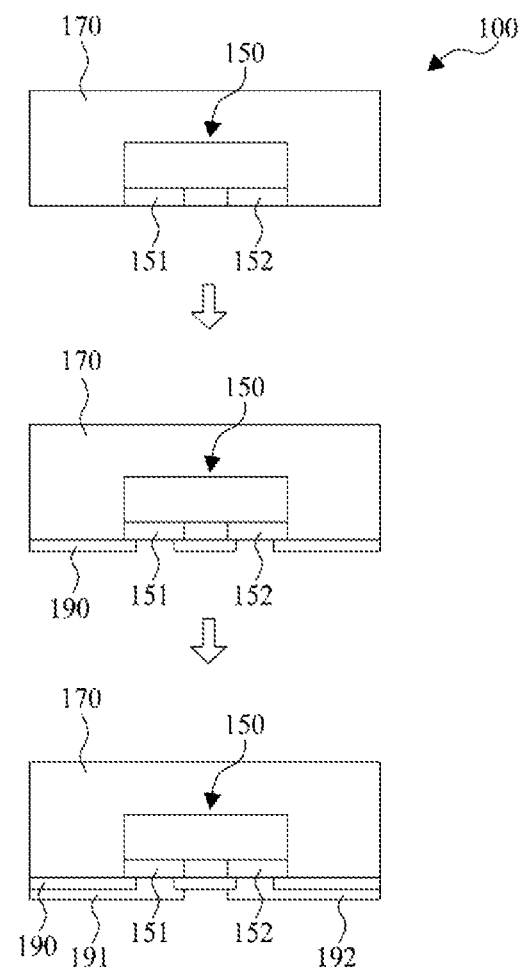
FIG. 5 shows an example of a CSP type semiconductor light emitting device disclosed in Korean Patent Laid-Open Publication No. 2013-0114011.

First, in S1, a sacrificial substrate 300 is prepared. The sacrificial substrate 300 may include a light-transmitting support plate 301 through which UV rays are transmitted, and a sacrificial layer 302 formed on the light-transmitting support plate 301. The light-transmitting support plate 301 is one of glass or sapphire substrates. The sacrificial layer 302 may be one of GaN, $SiO_2$, GaP, PI, SiN, ITO, or epoxy resin. Next, in S2, the first electrodes 310 are formed on the sacrificial substrate 300. The first electrodes 310 may be obtained by depositing Au (gold) at a high temperature (e.g., 100° C. or higher). Following this, at least one semiconductor light emitting chip 320 is electrically connected to the first electrodes 310, as shown in S3. The conductive adhesive material 330 may be used for electrical connection between the first electrodes 310 and the semiconductor light emitting chip 320 that is carried out after the formation of the first electrodes 310. Referring next to S4, the encapsulation member 340 is formed to cover the first electrodes 310 and the semiconductor light emitting chip 320. According to the method for manufacturing a semiconductor light emitting device of the present disclosure, the material used for the encapsulation member 340 is selected from a group of resins (e.g., polyimide, epoxy resin, etc.) having a greater degree of expansion and contraction than that of metals with changes in temperature. Because the encapsulation member 340 is formed after the high-temperature metal deposition process for preparing the first electrodes 310 is completed, however, deterioration in adhesion between the encapsulation member 340 and the first electrodes 310 caused by the expansion and contraction of the encapsulation member 340 will not occur. In an alternate embodiment, the encapsulation member 340 may be omitted. For example, in case of the prior art semiconductor light emitting device shown in FIG. 5, the encapsulation member 170 is absolutely required as a support plate such that the first electrodes 191 and 192 may be formed thereon. However, the first electrodes 310 in the present disclosure are formed on the sacrificial substrate 300, meaning that a separate encapsulation member is no longer required, and the sacrificial substrate 300 is removed later on as shown in S5 by an LLO (Laser Lift-Off) process where laser is used to separate the sacrificial layer 302. Then, in S6, a cutting process is carried out along those dotted lines to obtain individual semiconductor light emitting devices 350. When two or more semiconductor light emitting chips 320 are present and neighboring semiconductor light emitting chips 320 share a first electrode 310 together, the encapsulation member 340 as well as the first electrode 310 are cut out to obtain each individual semiconductor light emitting device 200 as illustrated in FIG. 6. However, in this case, the outer surfaces 222 of the first electrodes 220 may be exposed from the encapsulation member 230, and metal burrs may occur during the cutting process or the solder 241 may get on over the external lateral surfaces 222 of the first electrodes 220 during connecting to an external substrate, as shown in FIG. 7(b). Therefore, when multiple (e.g., at least two) semiconductor light emitting chips 320 are present and neighboring semiconductor light emitting chips 320 are electrically connected to the first electrodes 310, respectively, only the encapsulation member 340 may be subjected to cutting along the dotted line (see FIG. 10), resulting in a semiconductor light emitting device 200 in which the outer lateral surfaces 222 of the first electrodes 220 are covered with the encapsulation member 230 as shown in FIG. 7(a). In particular, S2 and S3 in FIG. 9 illustrate that the semiconductor light emitting chips 320 make electrical connections with the first electrodes 310, respectively, given that two or more semiconductor light emitting chips 320 are available.

Figure 11:
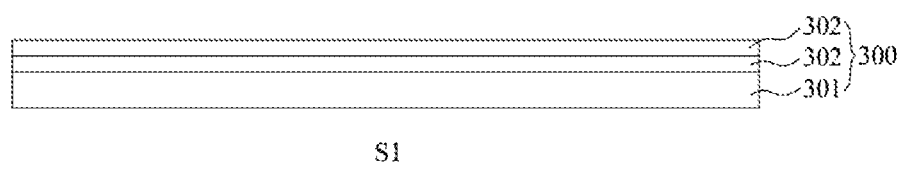
FIG. 11 shows another exemplary embodiment of a method for manufacturing a semiconductor light emitting device according to the present disclosure.

FIG. 11 shows another exemplary embodiment of a method for manufacturing a semiconductor light emitting device according to the present disclosure.

While S1 in FIG. 9 for preparing the sacrificial substrate 300 is carried out, a buffer layer 303 is additionally formed on the sacrificial layer 302 over the sacrificial substrate 300 (see S1 in FIG. 11). The buffer layer 303 may be made of at least one selected from the group consisting of $SiO_2$, SiN, SiON, $Al_2O_3$, and metals. In particular, the buffer layer 303 is provided to protect the first electrodes from potential damages by laser during the LLO process for removing the sacrificial substrate 300. Similar to S5 in FIG. 9, during the removal of the sacrificial substrate 300, the sacrificial layer 302 is separated using laser, removing the light-transmitting substrate 301 as well. Then the buffer layer 303 remaining on the side of the first electrode 310 may be removed by dry or wet etching. Except for the features described above with reference to FIG. 11, the method for manufacturing a semiconductor light emitting device illustrated in FIG. 11 is substantially the same as the method for manufacturing a semiconductor light emitting device illustrated in FIG. 9.

Figure 12:
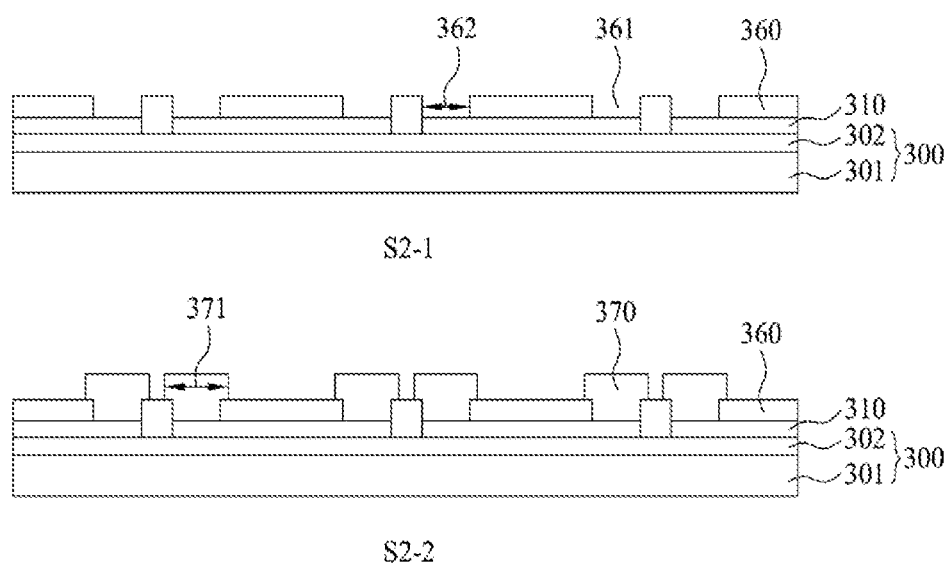
FIG. 12 shows another exemplary embodiment of a method for manufacturing a semiconductor light emitting device according to the present disclosure.

FIG. 12 shows another exemplary embodiment of a method for manufacturing a semiconductor light emitting device according to the present disclosure.

The method in FIG. 12 includes the step of forming insulation layers 360 with thru holes 361 (see S2-1) between the step of forming the first electrodes 310 on the sacrificial substrate 300 (see S2 in FIG. 9) and the step of electrically connecting at least one semiconductor light emitting chip 320 to the first electrodes 310 (see S3 in FIG. 9). The insulation layers 360 are prepared by a high-temperature (e.g., 250° C. or higher) deposition process such that high adhesion is obtained between the first electrodes 310 and the insulation layers 360. This will alleviate a detachment or separation issue between the insulation layers 360 and the resin-based encapsulation member that is formed later. Additionally, as the first electrodes 310 are not easily peeled off from the encapsulation member, reliability in the manufacturing method can be increased. Following the step of forming the insulation layers 360 with the thru holes in S2-1, the method further includes the step of forming second electrodes 370 in the thru holes 361 of the insulation layers 360 (see S2-2 in FIG. 12). Here, the size of an upper surface 371 of the second electrode 370 is preferably larger than the size of an upper surface 362 of the thru hole 361, in order to facilitate electrical connection with pad electrodes of the semiconductor light emitting chips that are spaced closed to each other. Moreover, considering that the insulation layer 360 is formed before the semiconductor light emitting chips 320 are electrically connected in S3, it is more desirable that the insulating material filled in-between the inner lateral surfaces 311 of the first electrodes 310 serves as the insulation layer 360, not as the encapsulation member 340 which is formed after the semiconductor light emitting chips 320 are electrically connected in S3. This is because it is practically difficult to fill the encapsulation member, which is formed after electrical connections between the semiconductor light emitting chips 320 and the first electrodes 310 were done as aforementioned, in-between the inner lateral surfaces 311 of the first electrodes 310 as the gap between the first electrodes 310 and those smaller semiconductor light emitting chips 320 (which are often used nowadays) is getting narrower, impeding the permeation of the encapsulation member 340 therein. If an insulating material is present in-between the inner lateral surfaces 311 of the first electrodes 310, it can serve as a solder resist and contribute to enhanced electrical reliability when semiconductor light emitting devices 350 are to be electrically connected to an external substrate. However, if the insulating material is a resin-based encapsulation member 340, the encapsulation member 340 may undergo expansion and contraction by heat during the soldering process, resulting spaces between the inner lateral surfaces 311 of the first electrodes 310 and the encapsulation member 340 and allowing the solder to invade into the spaces, leading to an electrical failure. For these reasons, it is desired that the insulation layer 360 is formed of a material with less thermal distortion, instead of the resin-based encapsulation member 340. Referring again to FIGS. 9-12, the encapsulation member 340 or the insulation layer 360, both being an insulating material, is disposed, together with the first electrode 310, over the sacrificial substrate 300, without a step between the lower surface of the first electrode 310 and the insulating material. Except for the features described above with reference to FIG. 12, the method for manufacturing a semiconductor light emitting device illustrated in FIG. 12 is substantially the same as the method for manufacturing a semiconductor light emitting device illustrated in FIG. 9.

Accordingly, the method for manufacturing a semiconductor light emitting device of the present disclosure enables to form the first electrodes or the insulating layers in the absence of an encapsulation member.

What is claimed is:

1. A method for manufacturing a semiconductor light emitting device, comprising:
preparing a sacrificial substrate including a light-transmitting support plate and a sacrificial layer formed on the light-transmitting support plate;
forming first electrodes on the sacrificial substrate;
electrically connecting at least one semiconductor light emitting chip to the first electrodes; and
removing the sacrificial substrate to expose the first electrodes externally,
wherein preparing a sacrificial substrate includes forming a sacrificial layer and forming a buffer layer on the sacrificial layer.

2. The method of claim 1, further comprising:
after electrically connecting at least one semiconductor light emitting chip to the first electrodes, forming an encapsulation member for covering the first electrodes and the at least one semiconductor light emitting chip.

3. The method of claim 2, wherein the light-transmitting support plate is a glass or sapphire substrate, the sacrificial layer comprises one selected from the group consisting of GaN, $SiO_2$, GaP, PI, SiN, ITO, and epoxy resin, and removing the sacrificial substrate includes separating the sacrificial layer using laser.

4. The method of claim 1, wherein the buffer layer comprises at least one selected from the group consisting of $SiO_2$, SiN, SiON, $Al_2O_3$, and metals.

5. The method of claim 4, wherein removing the sacrificial substrate includes separating the sacrificial layer using laser, and the buffer layer remaining on the first electrode is removed by a dry or wet etching process.

6. A method for manufacturing a semiconductor light emitting device, comprising:
preparing a sacrificial substrate including a light-transmitting support plate and a sacrificial layer formed on the light-transmitting support plate;
forming first electrodes on the sacrificial substrate;
electrically connecting at least one semiconductor light emitting chip to the first electrodes; and
removing the sacrificial substrate to expose the first electrodes externally,
wherein electrically connecting at least one semiconductor light emitting chip to the first electrodes includes electrically connecting two or more semiconductor light emitting chips to the first electrodes, with neighboring semiconductor light emitting chips sharing one first electrode together.

7. The method of claim 6, further comprising:
cutting the encapsulation member and the first electrodes to obtain individual semiconductor light emitting device, wherein each of the first electrodes is shared by neighboring semiconductor light emitting chips.

8. A method for manufacturing a semiconductor light emitting device, comprising:
preparing a sacrificial substrate including a light-transmitting support plate and a sacrificial layer formed on the light-transmitting support plate;
forming first electrodes on the sacrificial substrate;
electrically connecting at least one semiconductor light emitting chip to the first electrodes; and
removing the sacrificial substrate to expose the first electrodes externally,
wherein electrically connecting at least one semiconductor light emitting chip to the first electrodes includes electrically connecting two or more semiconductor light emitting chips to the first electrodes, and an encapsulation member is provided between the first electrodes, with each of the first electrodes being electrically connected to neighboring semiconductor light emitting chips.

9. The method of claim 8, further comprising:
cutting the encapsulation member provided between the first electrodes to obtain individual semiconductor light emitting devices, with each of the first electrodes being electrically connected to neighboring semiconductor light emitting chips.

10. A method for manufacturing a semiconductor light emitting device, comprising:
preparing a sacrificial substrate including a light-transmitting support plate and a sacrificial layer formed on the light-transmitting support plate;
forming first electrodes on the sacrificial substrate;
electrically connecting at least one semiconductor light emitting chip to the first electrodes; and
removing the sacrificial substrate to expose the first electrodes externally,
further comprising, between forming first electrodes on the sacrificial substrate and electrically connecting at least one semiconductor light emitting chip to the first electrodes:
forming insulation layers with thru holes on the first electrodes and the sacrificial substrate.

11. The method of claim 10, further comprising:
forming second electrodes in the thru holes of the insulation layers, with each of the second electrodes being disposed between the first electrode and the semiconductor light emitting chip to electrically connect the first electrode and the semiconductor light emitting chip,
wherein the second electrode has an upper surface larger than that of the thru hole.

12. The method of claim 10, wherein the insulation layer is formed of DBR or an insulating material comprises at least one selected from the group consisting of $SiO_2$, $Al_2O_3$, silicon nitride, epoxy resin, and polyimide.

* * * * *